(12) United States Patent
Harada et al.

(10) Patent No.: US 10,677,840 B2
(45) Date of Patent: Jun. 9, 2020

(54) ELECTRIC DEVICE SUPPRESSING VARIATIONS OF ELECTRIC CURRENT

(71) Applicant: OMRON Corporation, Kyoto (JP)

(72) Inventors: Hideki Harada, Kyoto (JP); Nobuo Kataoka, Ritto (JP); Seiji Mizutani, Moriyama (JP)

(73) Assignee: OMRON Corporartion, Kyoto (JP)

( * ) Notice: Subject to any disclaimer, the term of this patent is extended or adjusted under 35 U.S.C. 154(b) by 116 days.

(21) Appl. No.: 15/893,701

(22) Filed: Feb. 12, 2018

(65) Prior Publication Data

US 2019/0004106 A1 Jan. 3, 2019

(30) Foreign Application Priority Data

Jun. 29, 2017 (JP) .................... 2017-128014

(51) Int. Cl.
*G01R 31/28* (2006.01)
*G05F 1/618* (2006.01)

(52) U.S. Cl.
CPC ..... *G01R 31/2829* (2013.01); *G01R 31/2884* (2013.01); *G05F 1/618* (2013.01)

(58) Field of Classification Search
CPC . H02P 29/0241; G01R 15/207; G01R 31/025; G01R 31/3835; G01R 31/396; G01R 33/093; G01R 27/00; G01R 31/006; G01R 31/024; G01R 31/026; G01R 31/2829; G01R 31/2884; G01R 33/3875; G06F 17/18; G06F 3/0346; H01R 13/6683; G05F 1/618
See application file for complete search history.

(56) References Cited

U.S. PATENT DOCUMENTS

| | | | | |
|---|---|---|---|---|
| 4,359,030 A | * | 11/1982 | Sone | F02D 41/1494 123/697 |
| 7,719,248 B1 | * | 5/2010 | Melanson | H02M 1/4225 323/283 |
| 8,519,862 B2 | * | 8/2013 | Cortopassi | G06F 1/1626 340/309.16 |
| 9,225,252 B2 | * | 12/2015 | Drakshapalli | H02M 3/33507 |
| 2006/0220625 A1 | | 10/2006 | Chapuis | |

(Continued)

OTHER PUBLICATIONS

Wikipedia, "CPU power dissipation", Jun. 14, 2017, Retrieved from <https://en.wikipedia.org/w/index.php?title=CPU_power_dissipation &oldid=785610458>, retrieved on Jul. 30, 2018.

(Continued)

*Primary Examiner* — Vinh P Nguyen
(74) *Attorney, Agent, or Firm* — JCIPRNET

(57) ABSTRACT

An electric device capable of suppressing an influence of variation of a consumed current on a superimposed signal is provided. An electric device which transmits a superimposed signal obtained by superimposing a data signal on the operation signal according to a state of an operating element to the outside, includes a current consuming part configured to consume a current, and a current control part configured to control current consumption in a circuit including the current consuming part such that current variation of the superimposed signal following variation of the consumed current in the current consuming part is suppressed.

18 Claims, 12 Drawing Sheets

(56) References Cited

U.S. PATENT DOCUMENTS

2012/0091913 A1    4/2012  Arntson
2014/0252975 A1    9/2014  Drakshapalli et al.

OTHER PUBLICATIONS

"Search Report of Europe Counterpart Application", dated Aug. 16, 2018, p.1-p.10.
IO-Link, "IO-Link Interface and System Specification," Version 1.1.2, Jul. 2013, pp. 1-262.

* cited by examiner (CURRENT THAT IS COMPENSATED) =
(MAXIMUM CONSUMPTION CURRENT)-(CONSUMPTION CURRENT)

ELECTRIC DEVICE SUPPRESSING VARIATIONS OF ELECTRIC CURRENT

CROSS-REFERENCE TO RELATED APPLICATION

This application claims the benefit of Japanese application serial no. 2017-128014, filed on Jun. 29, 2017. The entirety of the above-mentioned patent application is hereby incorporated by reference herein and made a part of this specification.

BACKGROUND

Technical Field

The disclosure relates to an electric device.

Related Art

Conventionally, a 3-wire type electric device (a sensor or the like) that transmits and receives communication data in addition to detection information is known. Such an electric device required at least two power lines and one signal line to supply power and input and output signals. IO-Link (registered trademark) is one of three-wire type communication methods. A specification of IO-Link can be found in "IO-Link Interface and System Specification," Version 1.1.2, July 2013, IO-Link Community, Order No: 10.002, 4 Overview of SDCI, pp. 32-37 (Non-Patent Document 1).

However, in the technology of Non-Patent Document 1, there is a problem that the number of wires increases. Also, in the technology of Non-Patent Document 1, for example, a sensor converts a detection signal of the sensor into communication data and transmits the communication data to the outside. Therefore, there is a problem that it takes a long time for an external device to recognize the detection signal due to the conversion processing or circuit configurations of the sensor and the external device become complicated.

In order for a user to check a state (such as an operational/abnormal state) of a sensor, providing a light emitting diode (LED) or a self-diagnostic circuit in the sensor and determining a state of the sensor by a lighting state of the LED or a diagnostic result of the self-diagnostic circuit may be considered. However, since consumed currents of these members change according to operational states (ON/OFF), there is a concern that these members may affect a reading result of a value of a data signal. For example, in a sensor including an LED, when the LED is flashed, the LED repeats ON/OFF switching every 0.1 to 0.5 second. When an operational state of the LED changes from OFF to ON, a current is increased by the same amount as a change in a current due to a change in a value of a data signal. Therefore, there is a problem that a change in a current based on the switching of the operational state of the LED is misidentified as a change in a current due to a change in a value of a data signal, and erroneous reception in communication occurs.

To solve the above problem, it is necessary to suppress a change in a consumed current due to a change in, for example, an operational state of an LED or self-diagnostic circuit to prevent confusion with a change in a current indicating a change in a value of a data signal.

SUMMARY

An electric device according to an aspect of the disclosure is an electric device that transmits an operation signal according to a state of an operating element to the outside or receives an operation signal for controlling the operating element from the outside, and transmits a superimposed signal obtained by superimposing a data signal on the operation signal to the outside, and the electric device includes a current consuming part configured to consume a current following the processing in the electric device, and a current control part configured to control current consumption in a circuit including the current consuming part such that current variation of the superimposed signal following variation of the consumption power in the current consuming part is suppressed.

DESCRIPTION OF THE EMBODIMENTS

The disclosure provides an electric device with excellent convenience in which a data signal is not erroneously received even when power consumption of an element changes.

According to an aspect of the disclosure, it is possible to provide an electric device with excellent convenience in which an influence of variation of a consumed current on a superimposed signal is suppressed.

The inventor of the disclosure has developed a newly sensor for transmitting a data signal to a communication device as a superimposed signal obtained by superimposing the data signal on an operation signal output therefrom or an operation signal input thereto. In a communication method used by such a sensor and communication device, a current value of the data signal needs to be reduced to about 1/10 of a current value of the operation signal. For example, the data signal may transmit a specific value (H/L) by a current change of about 0 to 3 mA.

First Embodiment

An electric device 6 according to a first embodiment of the disclosure will be described below using FIGS. 1 to 5, 6A, 6B, 7A and 7B.

(Configuration of Control System 1)

Figure 2:
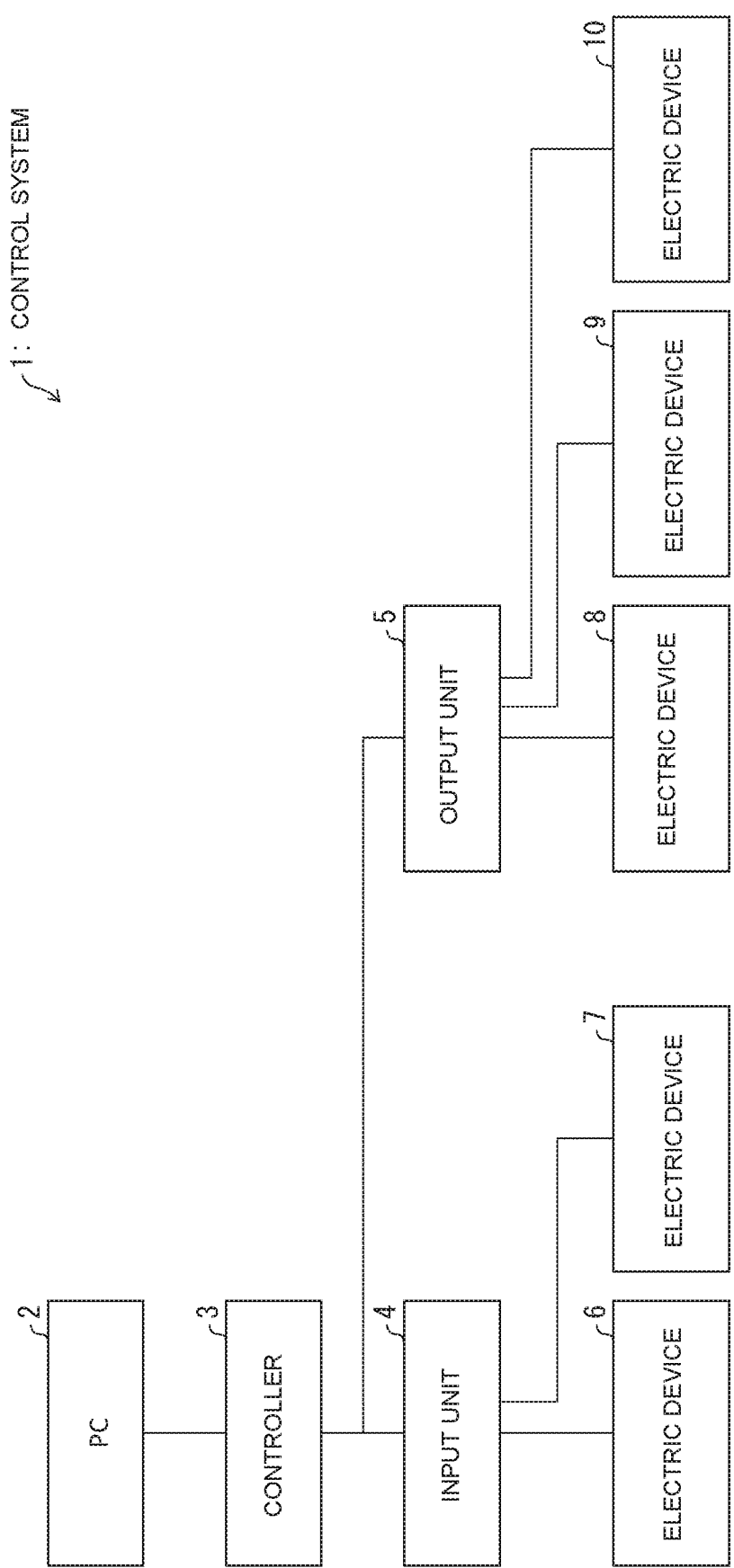
FIG. 2 is a block diagram illustrating a configuration of a control system according to an aspect of the disclosure.

FIG. 2 is a block diagram illustrating a configuration of a control system according to the present embodiment. The control system 1 includes a personal computer (PC, information processing device) 2, a controller 3, an input unit 4, an output unit 5, and electric devices 6 to 10. The PC 2 is connected to the controller 3. The PC 2 receives information on the electric devices 6 to 10 from the controller 3 and transmits a control command to the controller 3. The controller 3 is connected to the input unit 4 and the output unit 5. According to the control command, the controller 3 transmits a signal for operating or controlling the electric devices 6 to 10 to the input unit 4 and the output unit 5. The controller 3 transmits a signal from the electric devices 6 to 10 received via the input unit 4 or the output unit 5 to the PC 2.

The input unit 4 (receiving device) is connected to the electric devices 6 and 7. Each of the electric devices 6 and 7 is connected to the input unit 4 through a pair of signal lines. The input unit 4 operates the electric devices 6 and 7 and transmits a signal received from the electric devices 6 and 7 to the controller 3.

The electric devices 6 and 7 are operated by power supplied from the input unit 4 and transmit a signal according to a state of an operating element included in the electric devices 6 and 7 to the input unit 4. Here, the electric device 6 is a limit switch including a switch as an operating element. The electric device 7 is a sensor including a sensing element as an operating element.

The output unit 5 (receiving device) is connected to the electric devices 8 to 10. Each of the electric devices 8 to 10 is connected to the output unit 5 by a pair of signal lines. The output unit 5 operates the electric devices 8 to 10 and controls the electric devices 8 to 10 on the basis of instructions from the PC 2 and the controller 3. The output unit 5 transmits a signal received from the electric devices 8 to 10 to the controller 3.

The electric devices 8 to 10 are operated by power supplied from the output unit 5 and are controlled by a control signal received from the output unit 5. Here, the electric device 8 is a relay device including a coil as an operating element. The electric device 9 is an electromagnetic valve including a coil as an operating element. The electric device 10 is an electric actuator including a coil as an operating element.

(Configurations of Electric Device 6 and Input Unit 4)

Figure 1:
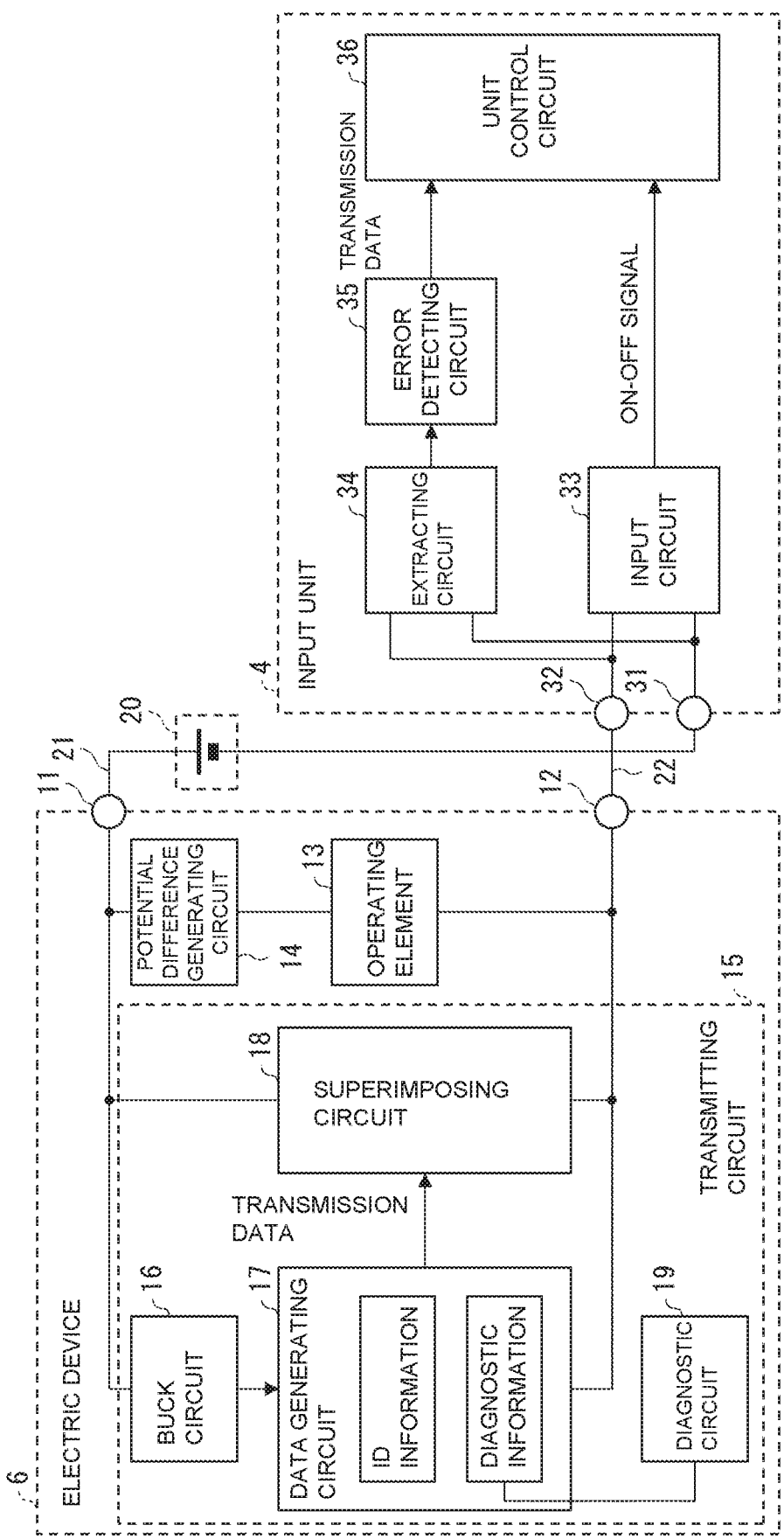
FIG. 1 is a block diagram illustrating configurations of an electric device and an input unit according to an aspect of the disclosure.

FIG. 1 is a block diagram illustrating configurations of the electric device 6 and the input unit 4. Here, the electric device 6 (a limit switch) and the input unit 4 will be described as an example. The electric device 6 and the input unit 4 are connected to each other by a pair of signal lines 21 and 22. The signal line 21 is connected to a first input terminal 31 of the input unit 4 and a first terminal 11 of the electric device 6. The signal line 22 is connected to a second input terminal 32 of the input unit 4 and a second terminal 12 of the electric device 6. A power supply 20 is provided in a path of the signal line 21. The power supply 20 is a DC power supply that generates a predetermined voltage (here, 24 V).

The electric device 6 includes the first terminal 11, the second terminal 12, an operating element 13, a potential difference generating circuit 14, and a transmitting circuit 15. The transmitting circuit 15 includes a buck circuit 16, a data generating circuit 17, a superimposing circuit 18, and a diagnostic circuit 19. The operating element 13 is connected between the first terminal 11 and the second terminal 12. The potential difference generating circuit 14 is connected in series to the operating element 13 in a current path between the first terminal 11 and the second terminal 12. A potential of the second terminal 12 changes according to a state of the operating element 13. That is, the second terminal 12 outputs an output signal (operation signal) according to the state of the operating element 13 to the outside (the signal line 22).

The transmitting circuit 15 is connected between the first terminal 11 and the second terminal 12. The transmitting circuit 15 operates by using a voltage between the first terminal 11 and the second terminal 12 as a power supply. The buck circuit 16 drops the voltage between the first terminal 11 and the second terminal 12 to a predetermined voltage and outputs a predetermined voltage to the data generating circuit 17. The data generating circuit 17 operates by a voltage applied from the buck circuit 16 and generates transmission data that needs to be transmitted to the input unit 4. The transmission data includes, for example, an identifier (ID information) unique to the electric device 6. The data generating circuit 17 outputs the transmission data to the superimposing circuit 18. The superimposing circuit 18 superimposes the received transmission data on the output signal as a data signal. In this way, the transmitting circuit 15 outputs the superimposed signal obtained by superimposing the data signal on the output signal to the signal line 22 from the second terminal 12.

The diagnostic circuit 19 operates by a voltage applied from the buck circuit 16 and generates diagnostic data indicating diagnostic information of the electric device 6. The diagnostic circuit 19 includes a check circuit for an element of the electric device 6 (for example, the operating element 13) and generates diagnostic data indicating whether the electric device 6 is normal according to whether an output of the check circuit is normal. The diagnostic circuit 19 outputs the diagnostic data (diagnostic information) to the data generating circuit 17. The data generating circuit 17 may include the diagnostic data in the transmission data.

The input unit 4 includes the first input terminal 31, the second input terminal 32, an input circuit 33, an extracting circuit 34, an error detecting circuit 35, and a unit control circuit 36. In FIG. 1, a configuration of a portion of transmission to the controller 3 is not illustrated. The potential of the first input terminal 31 is maintained constant (for example, at ground (GND) potential). The superimposed signal is input to the second input terminal 32 from the signal line 22.

The input circuit 33 extracts an output signal from the superimposed signal and outputs the output signal to the unit control circuit 36. The extracting circuit 34 extracts a data signal from the superimposed signal and outputs the data signal to the error detecting circuit 35. The error detecting circuit 35 performs error detection on the data signal using an arbitrary data checking method such as a cyclic redundancy check (CRC) or Manchester code check. The error detecting circuit 35 outputs the data signal and a result of the error detection to the unit control circuit 36. When an error is detected from the data signal, the error detecting circuit 35 may not output the data signal to the unit control circuit 36. The unit control circuit 36 outputs the output signal and the data signal to the controller 3. The error detecting circuit 35 and the unit control circuit 36 may be configured by, for example, a single integrated circuit (IC) or a plurality of integrated circuits (ICs).

(Configuration of Superimposed Signal)

Figure 3:
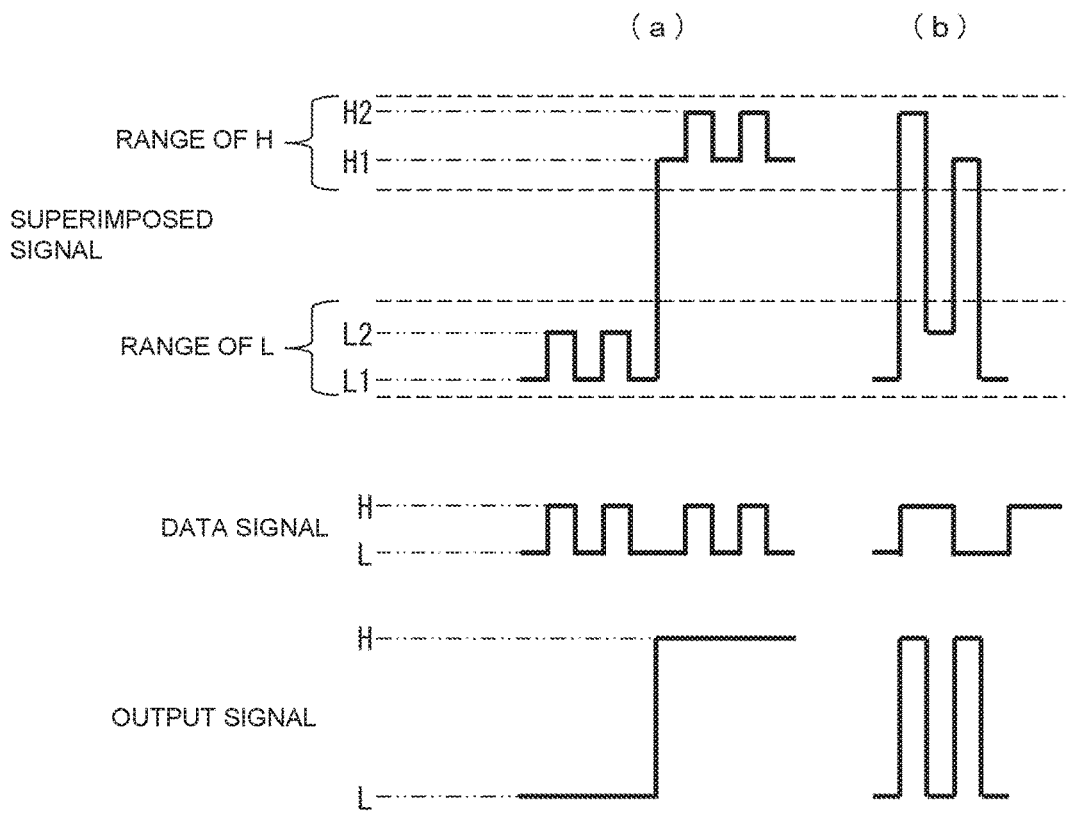
FIG. 3 is a view schematically illustrating an example of a signal waveform.

A configuration of a superimposed signal that the electric device 6 according to an aspect of the disclosure uses in communication will be described using FIG. 3. FIG. 3 is a view schematically illustrating an example of a signal waveform. (a) of FIG. 3 shows a case in which a period of an output signal (operation signal) is longer than a period of a data signal, and (b) of FIG. 3 shows a case in which a period of an output signal is shorter than a period of a data signal. A superimposed signal is a signal obtained by superimposing an output signal and a data signal. A waveform of the superimposed signal is obtained by superimposing a waveform of the output signal and a waveform of the data signal. An amplitude of the output signal is larger than an amplitude of the data signal. Therefore, a value of the original output signal and a value of the data signal can be known from the superimposed signal. The output signal becomes H when the switch of the electric device 6 is ON, and the output signal becomes L when the switch of the electric device 6 is OFF.

The value of the superimposed signal may be divided into L1, L2, H1, and H2 from the low side. When the superimposed signal is within the range of L, the output signal is L. The range of L includes L1 and L2. When the superimposed signal is within the range of H, which is higher than the range of L, the output signal is H. The range of H includes H1 and H2. When the superimposed signal is L1 or H1, the data signal is L. When the superimposed signal is L2 or H2, the data signal is H.

(Configuration of Electric Device in Comparative Example)

Figure 4:
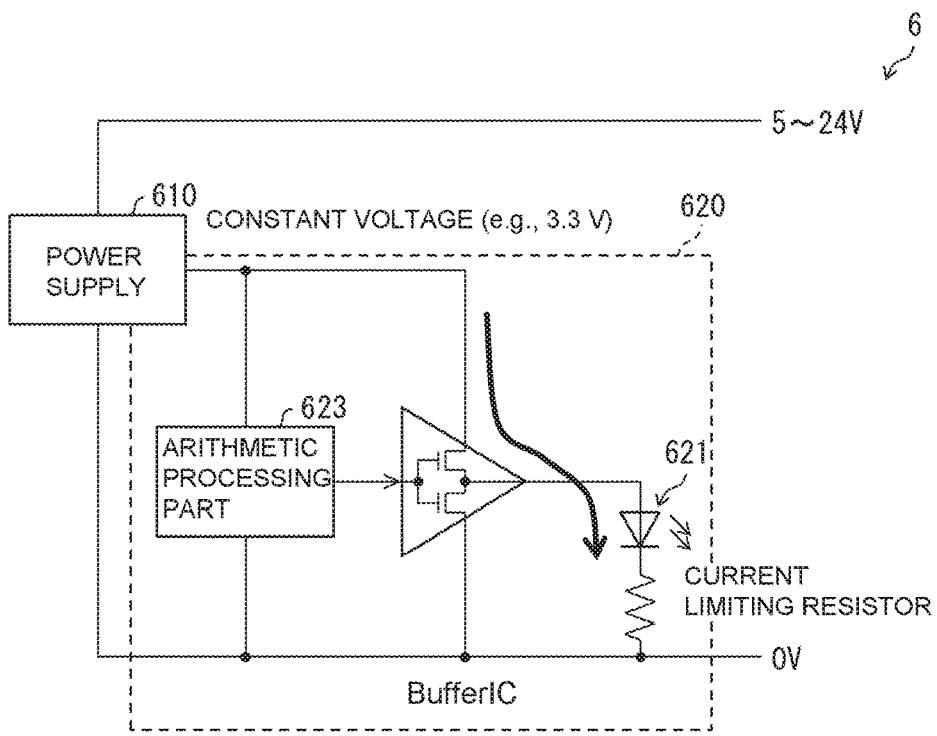
FIG. 4 is a circuit diagram illustrating an example of a circuit configuration of an electric device as a comparative example.

A configuration of the electric device 6 as a comparative example will be described below using FIG. 4. FIG. 4 is a circuit diagram illustrating an example of a circuit configuration of the electric device 6 as a comparative example.

The electric device 6 includes a power supply 610 and a current consuming part 620, and the current consuming part 620 includes at least a light emitting part 621 and an arithmetic processing part 623. In FIG. 4, the configurations of the first terminal 11, the second terminal 12, the operating element 13, the potential difference generating circuit 14, the data generating circuit 17, the superimposing circuit 18, and the like illustrated in FIG. 1 are not illustrated.

The power supply 610 corresponds to the buck circuit 16 illustrated in FIG. 1 and applies a constant voltage (for example, 3.3 V) to the current consuming part 620.

The current consuming part 620 is a circuit portion consuming a current supplied from the power supply 610 following processing in the electric device 6. In the illustrated example, the current consuming part 620 includes a buffer IC and a current limiting resistor in addition to the light emitting part 621 and the arithmetic processing part 623. In the following description, current consumption by the buffer IC and the current limiting resistor may be ignored.

The light emitting part 621 may be, for example, an LED which performs at least one of turning on a light, turning off the light, and flashing the light by the arithmetic processing part 623 controlling the buffer IC.

The arithmetic processing part 623 is, for example, a micro processing unit (MPU) capable of controlling a current input to the buffer IC according to a state of the operating element (not illustrated). The arithmetic processing part 623 may also have a function of the data generating circuit 17 illustrated in FIG. 1.

The buffer IC is an electric switch capable of switching ON/OFF of the current to the light emitting part 621 according to the current input from the arithmetic processing part 623.

The current limiting resistor is a resistor connected in direct current to the light emitting part 621 and configured to define an upper limit of a current value flowing in the light emitting part 621. The current limiting resistor may be omitted.

(Operation of Electric Device as Comparative Example)

The operation of the electric device 6 as a comparative example will be described.

By switching the operation of the buffer IC in the arithmetic processing part 623, the electric device 6 may flow a current to the light emitting part 621 and switch the light emitting part 621 from a turned-off state to a turned-on state. Here, a current input from the power supply 610 is consumed by the light emitting part 621 and the arithmetic processing part 623. When the light emitting part 621 is switched from the turned-on state to the turned-off state, because the current input from the power supply 610 does not pass through the light emitting part 621, the current is consumed only by the arithmetic processing part 623. Accordingly, a consumed current of the current consuming part 620 when the light emitting part 621 is turned on is larger than a consumed current of the current consuming part 620 when the light emitting part 621 is turned off. Therefore, when the circuit configuration of FIG. 4 is applied to an electric device that performs communication using a superimposed signal, there is a concern that a change in a consumed current that occurs when an operational state of the light emitting part 621 is switched may be confused with a change in a current due to a change in a value of a data signal.

(Configuration of Electric Device)

Figure 5:
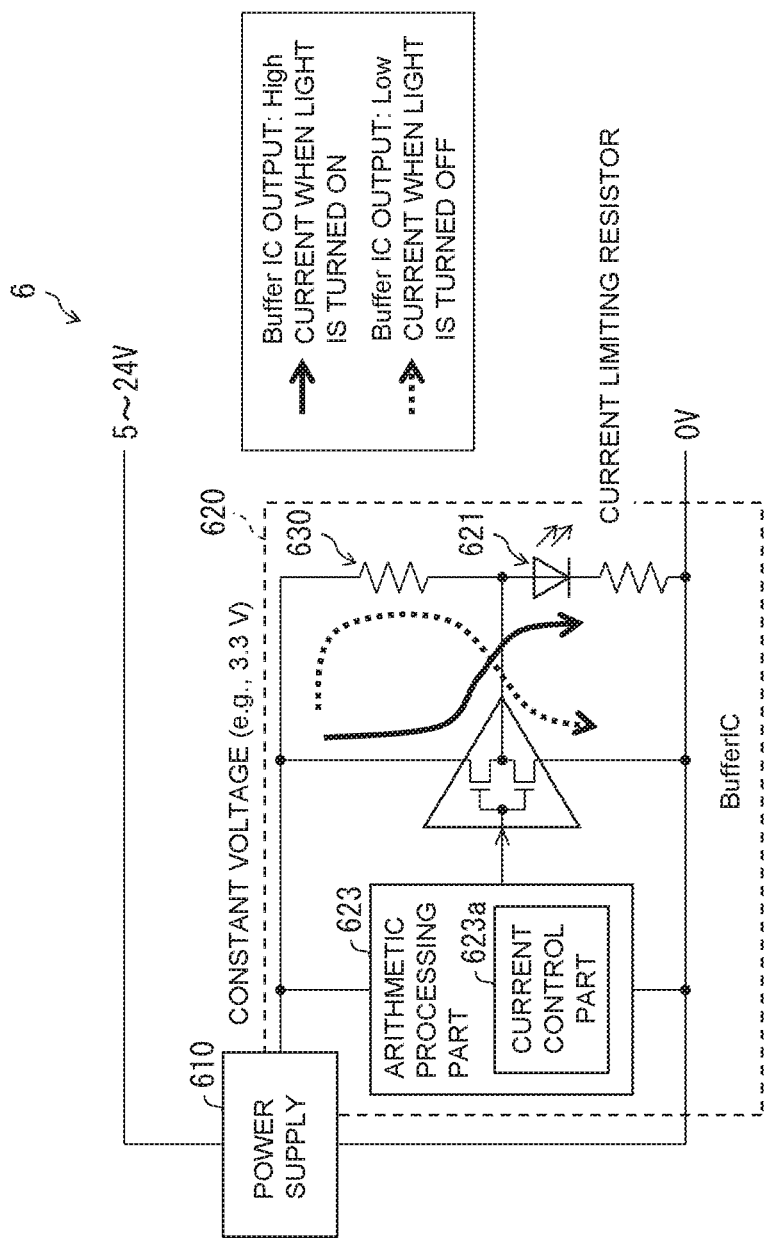
FIG. 5 is a circuit diagram illustrating an example of a circuit configuration of an electric device according to a first embodiment of the disclosure.

The configuration of the electric device 6 according to an aspect of the disclosure will be described using FIG. 5. FIG. 5 is a circuit diagram illustrating an example of a circuit configuration of the electric device 6. Although the following description relates to the electric device 6, the description applies the same for the electric devices 7 to 10 of FIG. 2.

Although the basic configuration of the electric device 6 according to an aspect of the disclosure is the same as that of the electric device 6 according to FIG. 4, a partial configuration is different therefrom. In the present embodiment, the arithmetic processing part 623 includes a current control part 623a.

The current control part 623a controls current consumption in a circuit including the current consuming part 620 such that current variation of a superimposed signal following variation of a consumed current in the current consuming part 620 is suppressed. More specifically, the current control part 623a controls current consumption in the circuit including the current consuming part 620 such that a width of current variation of the superimposed signal following variation of the consumed current in the current consuming part 620 is set to a predetermined ratio or less with respect to a width of current variation of the superimposed signal based on a change in a value of a data signal.

The current consuming part 620 further includes a circuit having a first load 630. The first load 630 is a load that consumes a current corresponding to a case in which the current consuming part 620 consumes a current. More specifically, the first load 630 consumes a current that is almost the same as a current consumed when the light emitting part 621 is turned on.

(Operation of Electric Device)

The operation of the electric device 6 according to an aspect of the disclosure will be described.

The electric device 6 is the same as the electric device 6 as the comparative example that the operation of the buffer IC is switched in the arithmetic processing part 623.

When the light emitting part 621 is turned off, a current input from the power supply 610 flows through the first load 630 and the buffer IC. When the light emitting part 621 is turned on, the current input from the power supply 610 flows through the buffer IC, the light emitting part 621, and the current limiting resistor. Because the current consumption in the first load 630 is almost the same as current consumption when the light emitting part 621 is turned on, the consumed current in the current consuming part 620 of the electric device 6 may be suppressed from being varied according to an operational state of the light emitting part 621.

Figure 6A:
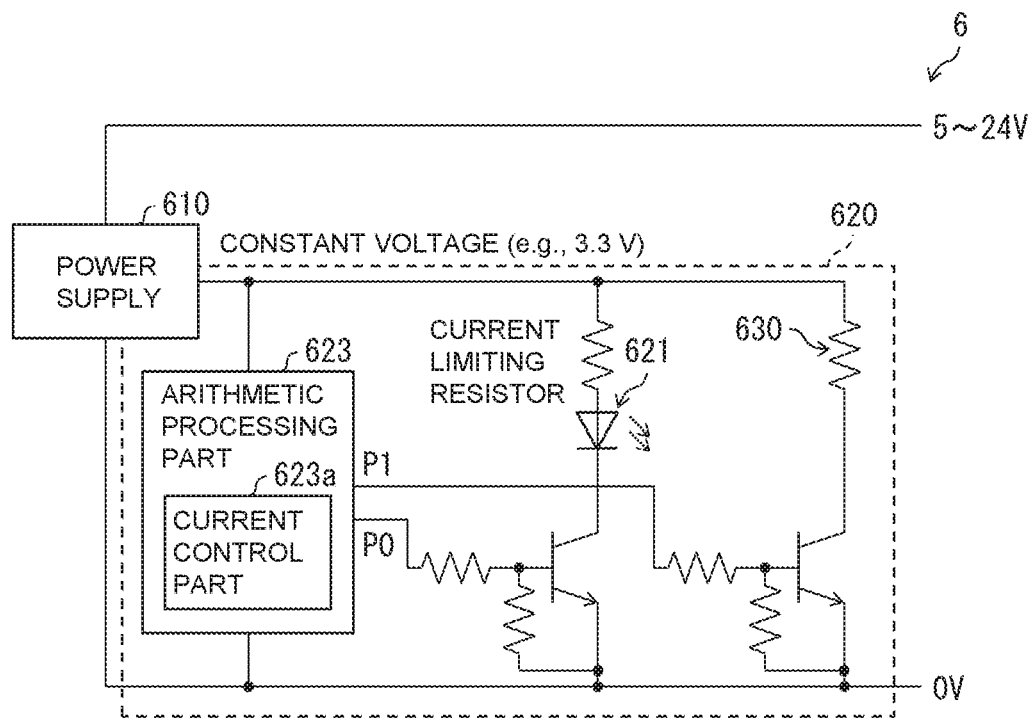
FIG. 6A is a circuit diagram when a circuit same as that of FIG. 5 is configured by a combination of a transistor and a resistor.

The electric device 6 according to an aspect of the disclosure may have a configuration different from that illustrated in FIG. 5 as long as the ON/OFF of the current input to the light emitting part 621 may be switched by control of the current control part 623a. A circuit configuration of the electric device 6 that performs an operation same as that of FIG. 5 using a combination of a transistor and a resistor instead of the buffer IC is shown in FIG. 6A. FIG. 6A is a circuit diagram when a circuit same as that of FIG. 5 is configured by a combination of a transistor and a resistor.

Figure 6B:
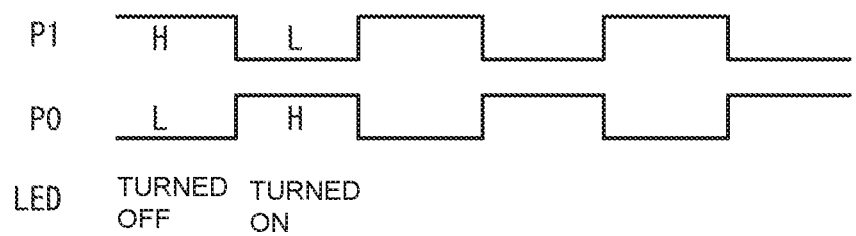
FIG. 6B is a view illustrating a combination of voltages output by an arithmetic processing part (623) and a state of a light emitting part (621).

In the illustrated example, the arithmetic processing part 623 includes two output systems such as P0 and P1. Each transistor may receive a current through the resistor from the arithmetic processing part 623 as a base current and perform switching between an emitter and a collector while controlling the base current. A combination of voltages output by the arithmetic processing part 623 is illustrated in FIG. 6B. FIG. 6B is a view illustrating a combination of voltages output by the arithmetic processing part 623 and a state of the light emitting part 621. For example, with respect to a magnitude of voltage output from P0 and P1 by the arithmetic processing part 623, a value in the range in which conduction is allowed between the emitter and the collector is set as H, and a value in the range in which conduction is not allowed between the emitter and the collector is set as L. Here, when a value of a voltage output from P0 is H, and a value of a voltage output from P1 is L, the light emitting part 621 is turned on, and a current does not flow through the first load 630. When a value of a voltage output from P0 is L, and a value of a voltage output from P1 is H, the light emitting part 621 is turned off, and a current flows through the first load 630. By controlling the combination of voltages output from P0 and P1 such that a current is input to any one of the light emitting part 621 and the first load 630 in this way, an effect same as that of the circuit configuration illustrated in FIG. 5 can be obtained.

Second Embodiment

Figure 7A:
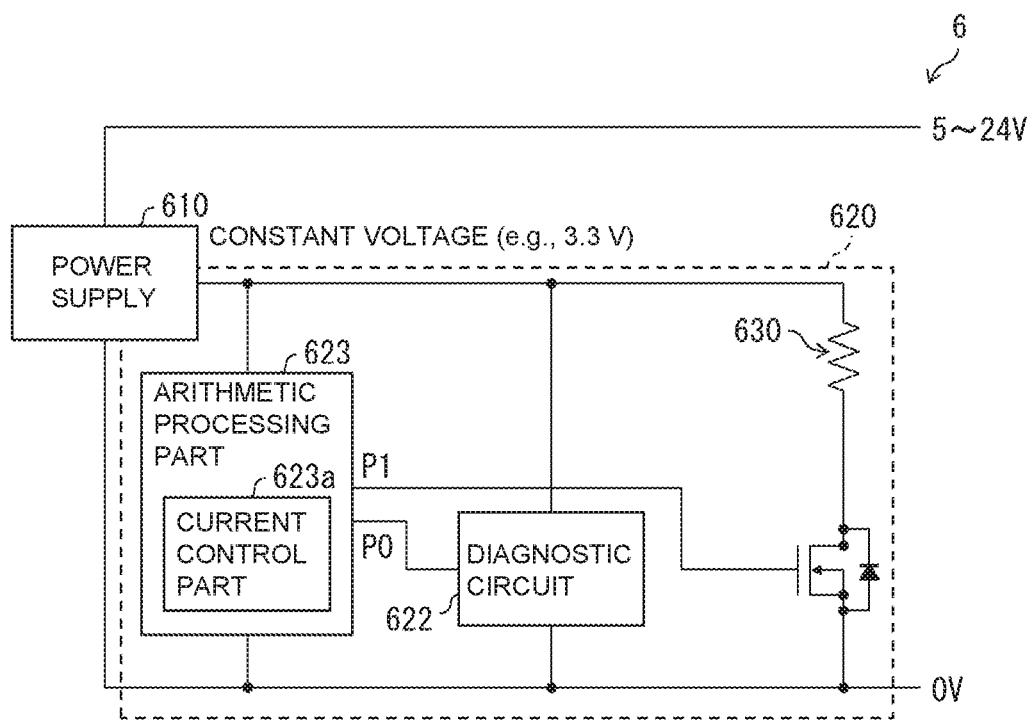
FIGS. 7A and 7B are a circuit diagram illustrating an example of a circuit configuration of an electric device according to a second embodiment of the disclosure.

The electric device 6 according to a second embodiment of the disclosure will be described using FIG. 7A. FIG. 7A is a circuit diagram illustrating an example of a circuit configuration of the electric device 6. For convenience of description, members having the same functions as those described in the first embodiment will be denoted by like reference numerals, and description thereof will be omitted.

(Configuration of Electric Device)

Although the basic configuration of the electric device 6 according to the present embodiment is the same as that in the first embodiment described using FIGS. 6A and 6B, a partial configuration is different therefrom. In the present embodiment, the electric device 6 includes a diagnostic circuit 622 instead of the light emitting part 621 and uses a metal-oxide semiconductor field-effect-transistor (MOSFET) instead of the transistor. In other words, in the electric device 6, like the light emitting part 621 in the first embodiment, the diagnostic circuit 622 varies a magnitude of the consumed current in the current consuming part 620 according to ON/OFF of an operation.

The diagnostic circuit 622 diagnoses the presence or absence of a failure in the electric device 6. An operational state of the diagnostic circuit 622 may be switched between an operating state and a stop state on the basis of a voltage output from P0 by the arithmetic processing part 623. Although the diagnostic circuit 622 and the arithmetic processing part 623 are illustrated as independent arithmetic circuits in the illustrated example, the diagnostic circuit 622 and the arithmetic processing part 623 may also be implemented by dividing the functions thereof in the same arithmetic circuit.

Although the basic configuration of the current control part 623a is the same as that in the first embodiment, the current control part 623a is different therefrom that a voltage output from the system P0 of the arithmetic processing part 623 is directly input to the diagnostic circuit 622, and a conduction state of the MOSFET is switched by controlling a voltage output from the system P1 of the arithmetic processing part 623. By controlling a combination of a voltage output from P0 and a voltage output from P1, the current control part 623a may control a current to be input to any one of the diagnostic circuit 622 and the first load 630.

(Operation of Electric Device)

Figure 7B:
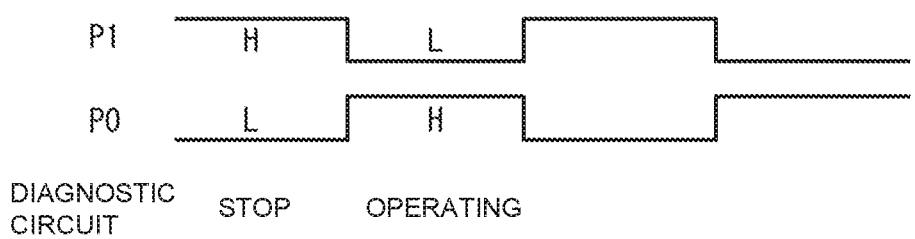

The operation of the electric device 6 according to an aspect of the disclosure will be described using FIG. 7B. FIG. 7B is a schematic diagram illustrating a combination of voltages output by the arithmetic processing part 623 and a state of the diagnostic circuit 622.

The operation of the electric device 6 is almost the same as that of the first embodiment illustrated using FIGS. 6A and 6B. That is, with respect to a magnitude of voltage output from the system P0 of the arithmetic processing part 623 by the current control part 623a, a value in the range in which the diagnostic circuit 622 is transitioned to the operating state is set as H, and a value in the range in which the diagnostic circuit 622 is transitioned to the stop state is set as L. With respect to a voltage output from the system P1 of the arithmetic processing part 623 by the current control part 623a and applied to a gate of the MOSFET, a value when conduction occurs between a source and a drain and a current is flowed to the first load 630 is set as H, and a value when conduction does not occur between the source and the drain is set as L. Here, when a value of a voltage output from P0 by the current control part 623a is H, and a voltage output from P1 and applied to the gate of the MOSFET is L, the diagnostic circuit 622 is transitioned to the operating state, and a current does not flow to the first load 630. On the other hand, when a value of a voltage output from P0 is L, and a voltage output from P1 and applied to the gate of the MOSFET is H, the diagnostic circuit 622 is transitioned to the stop state, and a current flows to the first load 630. By controlling the voltages output from P0 and P1 such that a current is input to any one of the diagnostic circuit 622 and the first load 630 in this way, current variation in the current consuming part 620 when the diagnostic circuit 622 is switched between the operating state and the stop state can be suppressed.

Third Embodiment

Figure 8A:
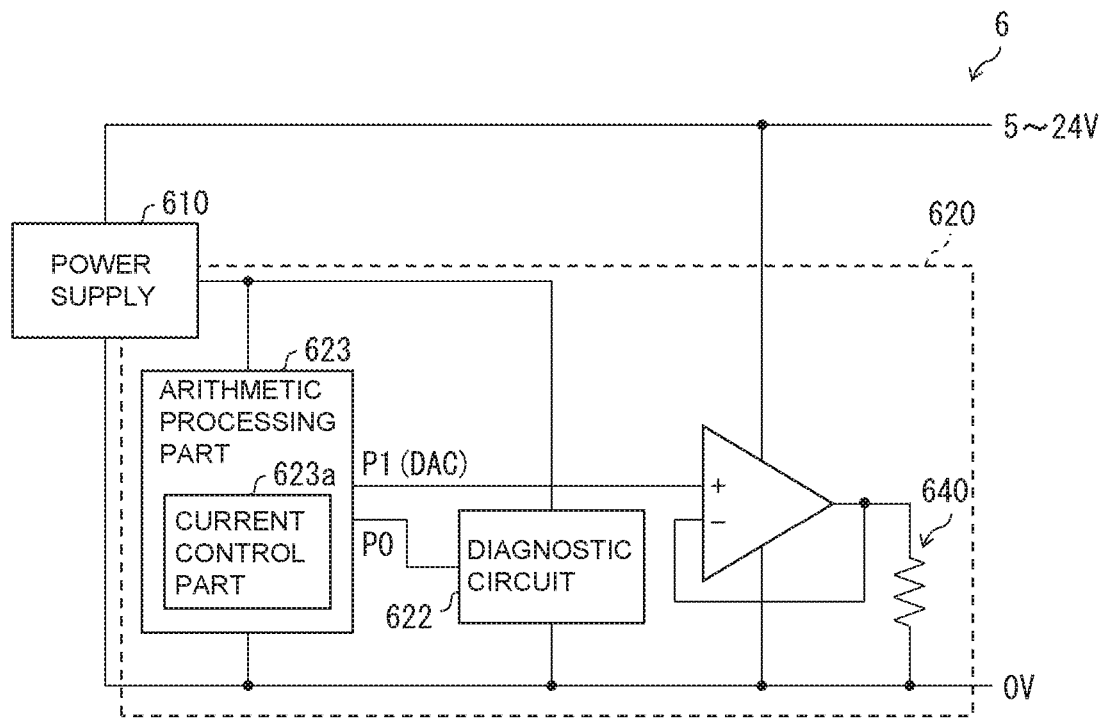
FIG. 8A is a circuit diagram illustrating an example of a circuit configuration of an electric device according to a third embodiment of the disclosure.

The electric device 6 according to a third embodiment of the disclosure will be described using FIGS. 8A and 8B. For convenience of description, members having the same functions as those described in the first embodiment will be denoted by like reference numerals, and description thereof will be omitted.

(Configuration of Electric Device)

The configuration of the electric device 6 according to the present embodiment will be described using FIG. 8A. FIG. 8A is a circuit diagram illustrating an example of a circuit configuration of the electric device 6.

Although the basic configuration of the electric device 6 is the same as that of the electric device 6 according to the second embodiment, a partial configuration is different therefrom. The electric device 6 is different that the electric device 6 includes a circuit having a second load 640 and, when a current when the current consuming part 620 consumes the current continuously changes, the current control part 623a is configured to perform control that continuously changes a consumed current in the second load 640 to cancel the continuous change. More specifically, when the consummation current in the diagnostic circuit 622 includes temporal variation, the electric device 6 may control a current input to the circuit having the second load 640 such that a total sum of a consumed current in the diagnostic circuit 622 and a consumed current in the second load 640 is always a predetermined consumed current value.

The current consuming part 620 is an output destination of a current of the arithmetic processing part 623, includes an operational amplifier instead of the transistor, and further includes, instead of the circuit having the first load 630, the circuit having the second load 640 connected in series to an output of the operational amplifier.

Although the arithmetic processing part 623 is the same as that of the second embodiment that the arithmetic processing part 623 includes two output systems, P0 and P1, an output from P1 is input to a positive (+) input terminal of the operational amplifier via a digital-to-analog converter (DAC) (not illustrated). A voltage output from P1 varies according to temporal variation of a consumed current in the diagnostic circuit 622. The temporal variation of the consumed current in the diagnostic circuit 622 may be pre-stored, and variation of voltage output from P1 may be performed on the basis of profile information set on the basis of the stored content. The DAC may be built in the arithmetic processing part 623.

Although the basic configuration of the diagnostic circuit 622 is the same as that of the second embodiment, the diagnostic circuit 622 is different therefrom that the consumed current is not varied in a binary manner between the operating state and the stop state but includes temporal variation in which the consumed current continuously changes. For example, when the diagnostic circuit 622 is transitioned from the stop state to the operating state, the consumed current in the diagnostic circuit 622 may be varied to be a maximum value after a predetermined time is elapsed. A specific example of the temporal variation of the consumed current will be described below.

Although the basic configuration of the current control part 623a is the same as that of the second embodiment, the current control part 623a is different therefrom that the current control part 623a controls a current input to the second load 640 such that a total sum of a consumed current in the diagnostic circuit 622 and a consumed current in the second load 640 is always a predetermined consumed current value. The predetermined consumed current value applied to the total sum of the consumed currents may be set to any value as long as the value is the maximum value of the consumed current in the diagnostic circuit 622 or higher. For example, the predetermined consumed current value may be equal to the maximum value of the consumed current in the diagnostic circuit 622.

The operational amplifier is an amplifier that amplifies a difference between voltages applied to the positive (+) input terminal and a negative (−) input terminal and outputs the amplified difference. In the illustrated example, because the output of the operational amplifier is connected to the negative (−) input terminal, a voltage applied to the positive (+) input terminal connected to the arithmetic processing part 623 and a voltage applied to the output are equal.

The second load 640 is a load connected in series to the output of the operational amplifier. As described above, the voltage applied to the output of the operational amplifier is equal to the voltage output from the arithmetic processing part 623 and applied to the positive (+) input terminal of the operational amplifier. Accordingly, the voltage applied to the second load 640 becomes equal to the voltage at a time point of output from the arithmetic processing part 623. In the illustrated example, because a resistance value of the second load 640 is constant, the magnitude of consumed current in the second load 640 is proportional to the voltage applied to the second load 640. That is, the consumed current in the second load 640 is proportional to a voltage applied from P1 to the positive (+) input terminal of the operational amplifier via the DAC by the arithmetic processing part 623. In the present embodiment, when a current when the current consuming part 620 consumes the current continuously changes, the second load 640 may continuously change a consumed current thereof to cancel the continuous change.

(Operation of Electric Device)

The operation of the electric device 6 according to an aspect of the disclosure will be described using FIG. 8B. FIG. 8B is a view illustrating temporal variation of a consumed current in the diagnostic circuit 622.

Figure 8B:
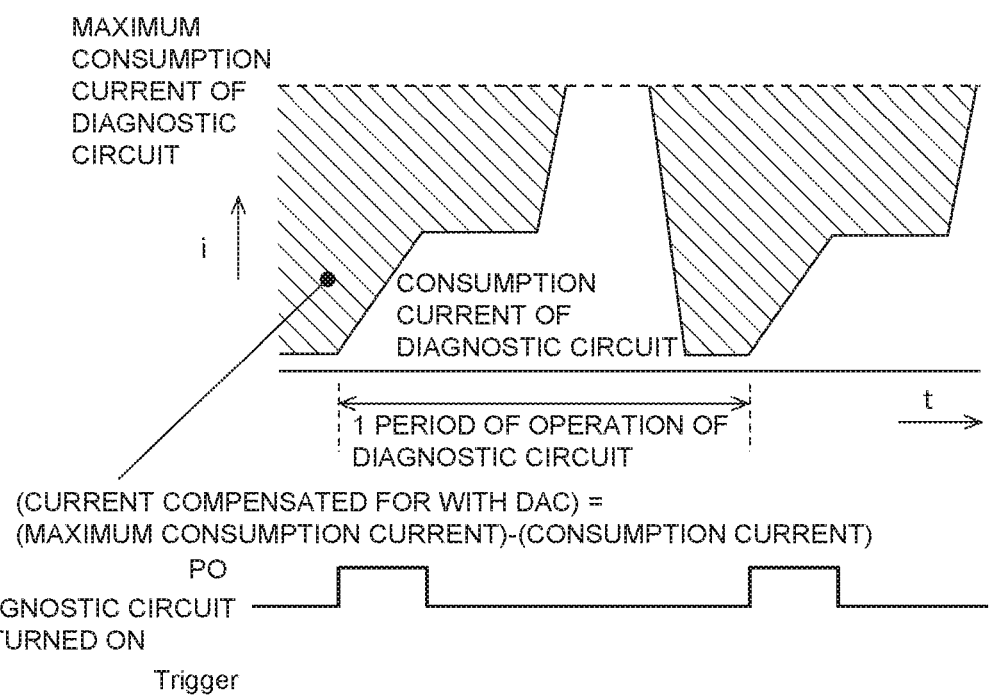
FIG. 8B is a view illustrating temporal variation of a consumed current in a diagnostic circuit.

FIG. 8B is a view illustrating temporal variation of the consumed current in the diagnostic circuit 622, in which the vertical axis indicates a magnitude of the consumed current in the diagnostic circuit 622, and the horizontal axis indicates time. In the lower part of the drawing, the timing of switching between the operating state and the stop state in the diagnostic circuit 622 is shown in synchronization with the drawing. In the illustrated example, when the switch of the diagnostic circuit 622 is turned ON, and the transition from the stop state to the operating state begins, the consumed current of the diagnostic circuit 622 increases in proportion to time from an initial value. Then, even when the switch of the diagnostic circuit 622 is turned OFF, and the transition from the operating state to the stop state begins, the consumed current maintains a constant value for a predetermined period and is further increased therefrom toward the maximum consumed current. After the consumed current reaches the maximum consumed current, the diagnostic circuit 622 maintains the maximum consumed current for a while and then gradually decreases the consumed current toward the initial value. Then, after the diagnostic circuit 622 maintains the initial value for a while, one period of the operation of the diagnostic circuit 622 is completed.

In the illustrated example, the hatched area represents a difference between the maximum consumed current of the diagnostic circuit 622 and the actual consumed current. That is, the consumed current of the second load 640 at certain time is controlled by the current control part 623a such that the consumed current of the second load 640 has a magnitude corresponding to the hatched area at that time. For example, when the diagnostic circuit 622 is in the operating state, because the consumed current of the diagnostic circuit 622 increases in proportion to time, the consumed current in the second load 640 decreases in proportion to time. When the consumed current in the diagnostic circuit 622 decreases toward the initial value from the maximum consumed current, due to the decrease, the consumed current in the second load 640 is increased.

In this way, when the consumed current of the diagnostic circuit 622 includes temporal variation, the electric device 6 according to the present embodiment may control a current input to the second load 640 such that the total sum of the consumed current and the consumed current in the second load 640 is always a predetermined consumed current value.

Figure 9:
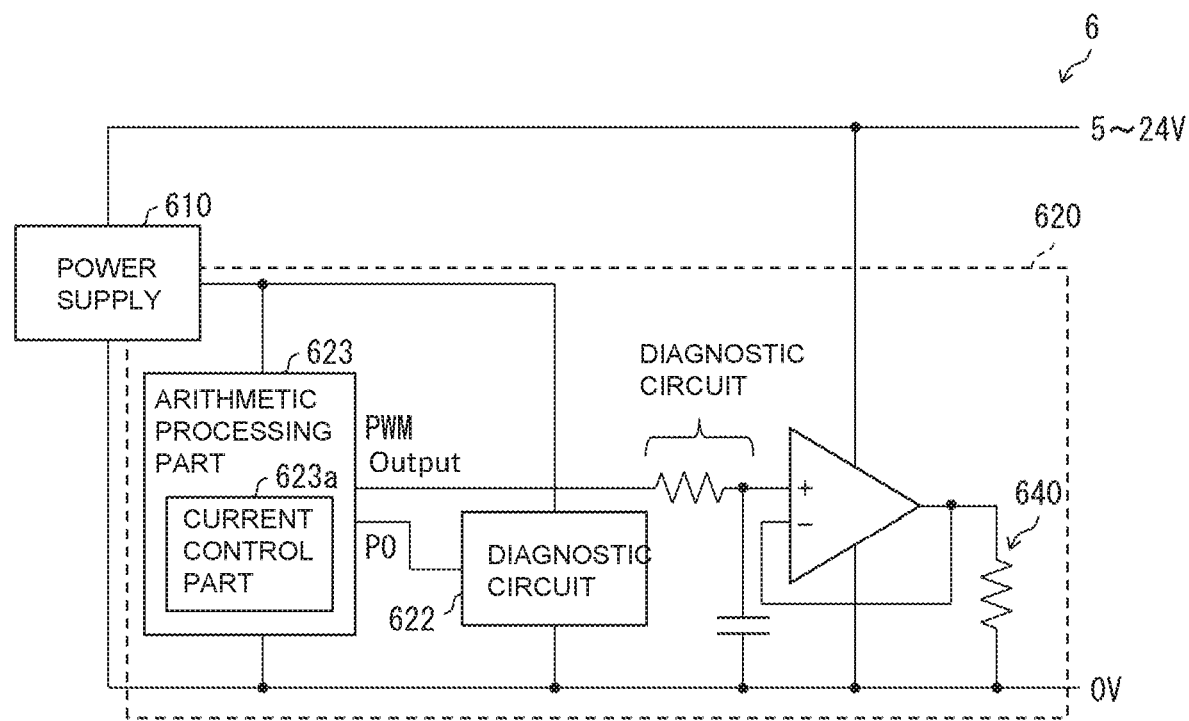
FIG. 9 is a circuit diagram when a circuit same as that of FIG. 8A is configured using a pulse width modulation (PWM) circuit and a smoothing circuit.
Figure 9:
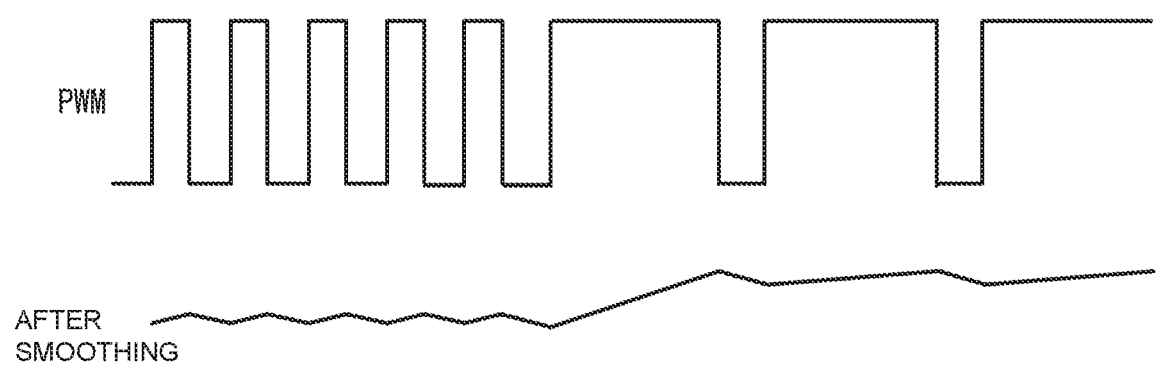

The current input from the system P1 of the arithmetic processing part 623 to the positive (+) input terminal of the operational amplifier may not be via the DAC. A configuration using a pulse width modulation (PWM) circuit and a smoothing circuit will be described using FIG. 9. FIG. 9 is a circuit diagram when a circuit same as that of FIG. 8A is configured using a PWM circuit and a smoothing circuit. A current output from the system P1 of the arithmetic processing part 623 is pulse-width modulated by the PWM circuit (not illustrated), passes through a resistor, which is a part of the smoothing circuit, and then is input to the positive (+) input terminal of the operational amplifier and a capacitor, which is a part of the smoothing circuit. In this way, the current input to the second load 640 may be controlled using the current, which is pulse-width modulated by the PWM circuit, such that the total sum of the consumed current in the diagnostic circuit 622 and the consumed current in the second load 640 is always a predetermined consumed current value.

Fourth Embodiment

The electric device 6 according to a fourth embodiment of the disclosure will be described using FIG. 10. For convenience of description, members having the same functions as those described in the first embodiment will be denoted by like reference numerals, and description thereof will be omitted.

(Configuration of Electric Device)

The configuration of the electric device 6 according to the present embodiment will be described using FIG. 10. FIG. 10 is a circuit diagram illustrating an example of a circuit configuration of the electric device 6.

Although the basic configuration of the electric device 6 is the same as that of the electric device 6 according to the third embodiment, a partial configuration is different therefrom. In addition to the circuit having the second load 640, the electric device 6 further includes a third load 650 for detecting a current value consumed in the diagnostic circuit 622 and changes the consumed current in the second load 640 according to a magnitude of a voltage drop due to the third load 650.

More specifically, on the basis of the magnitude of the voltage drop due to the third load 650, the electric device 6 may vary a voltage applied to the second load 640 to cancel the continuous change in the current when the current consuming part 620 consumes the current. That is, in the present embodiment, the current control part 623a is configured by a circuit including the third load 650.

The third load 650 is a load arranged between the power supply 610 and the diagnostic circuit 622 and the positive (+) input terminal of the operational amplifier. The voltage applied to the power supply 610 is dropped at the third load 650 and is divided for the diagnostic circuit 622 and the positive (+) input terminal of the operational amplifier.

A voltage via the load is applied to the input terminal of the operational amplifier from the power supply 610. According to the illustrated example, a voltage via the third load 650 is applied to the positive (+) input terminal of the operational amplifier from the power supply 610, and a voltage via a predetermined load is applied to the negative (−) input terminal of the operational amplifier from the power supply 610. A voltage fed back via another load from the output of the operational amplifier is combined with the voltage applied to the negative (−) input terminal of the operational amplifier. Here, because the voltage from the power supply 610 is divided in the third load 650 and the diagnostic circuit 622, when the consumed current in the diagnostic circuit 622 is varied, the voltage at the positive (+) input terminal of the operational amplifier is also varied. That is, by adjusting resistance values of the third load 650 and the second load 640 in consideration of the voltage variation and consumed current variation during the operation of the diagnostic circuit 622, the variation of voltage input to the operational amplifier, and the variation of consumed current in the second load 640, current variation in the current consuming part 620 may be suppressed regardless of the operational state of the diagnostic circuit 622.

In this way, the electric device 6 may detect a current value input to the current consuming part 620 using the third load 650 and control current consumption in the second load 640 according to the current value.

Figure 10:
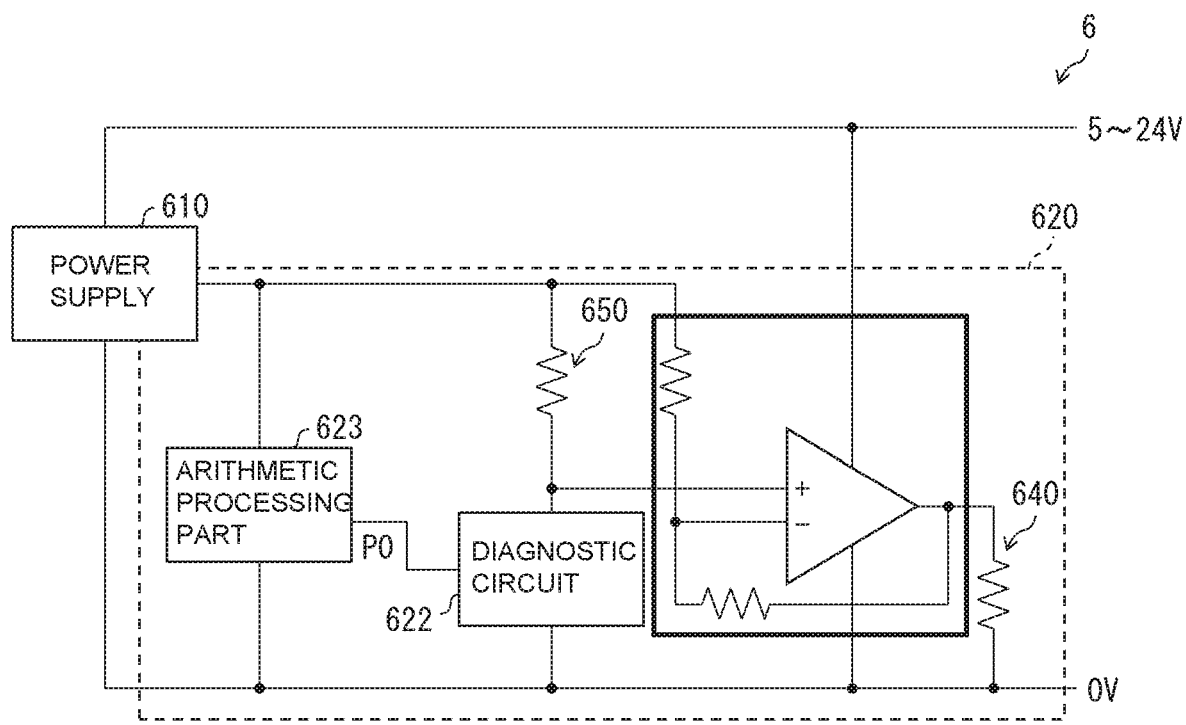
FIG. 10 is a circuit diagram illustrating an example of a circuit configuration of an electric device according to a fourth embodiment of the disclosure.

Instead of an electric circuit, enclosed by a thick line frame in FIG. 10, consisting of the operational amplifier, a resistor connected between the negative (−) input terminal of the operational amplifier and the power supply 610, and a resistor connected between an output terminal and the negative (−) input terminal of the operational amplifier, an analog-digital converting circuit may be provided. Here, the analog-digital converting circuit measures a magnitude of voltage drop due to the third load 650 and inputs the measurement result to the arithmetic processing part 623. The current control part 623a including the analog-digital converting circuit acquires the measurement result from the arithmetic processing part 623 and controls a voltage applied to the second load 640. The analog-digital converting circuit may be, for example, built in the same MPU as the arithmetic processing part 623.

Fifth Embodiment

The electric device 6 according to a fifth embodiment of the disclosure will be described using FIGS. 11A and 11B. For convenience of description, members having the same functions as those described in the first embodiment will be denoted by like reference numerals, and description thereof will be omitted.

(Configuration of Electric Device)

The configuration of the electric device 6 according to the present embodiment will be described. In the present embodiment, the electric device 6 includes the arithmetic processing part 623 and the diagnostic circuit 622 and does not include other components for adjusting a consumed current. The electric device 6 may perform execution control of arithmetic processing in the arithmetic processing part 623 to suppress variation in a total value of a consumed current in the diagnostic circuit 622 and a consumed current in the arithmetic processing part 623.

When the arithmetic processing part 623 has received a request to start a diagnostic operation using the diagnostic circuit 622, the arithmetic processing part 623 may execute the diagnostic operation and output diagnostic data. By executing an idle operation when the arithmetic processing part 623 has not received the request to start the diagnostic operation, the arithmetic processing part 623 may control variation of the consumed current in the arithmetic processing part 623.

The current control part 623a may perform execution control of arithmetic processing in the arithmetic processing part 623 to suppress a variation width of the total value of the consumed current in the diagnostic circuit 622 and the consumed current in the arithmetic processing part 623. More specifically, the consumed currents in the diagnostic circuit 622 and the arithmetic processing part 623 when the diagnostic operation is performed is controlled, variation of the consumed currents due to the idle operation in the arithmetic processing part 623 when the diagnostic operation using the diagnostic circuit 622 is not performed to be suppressed.

(Flow of Processing)

Figure 11B:
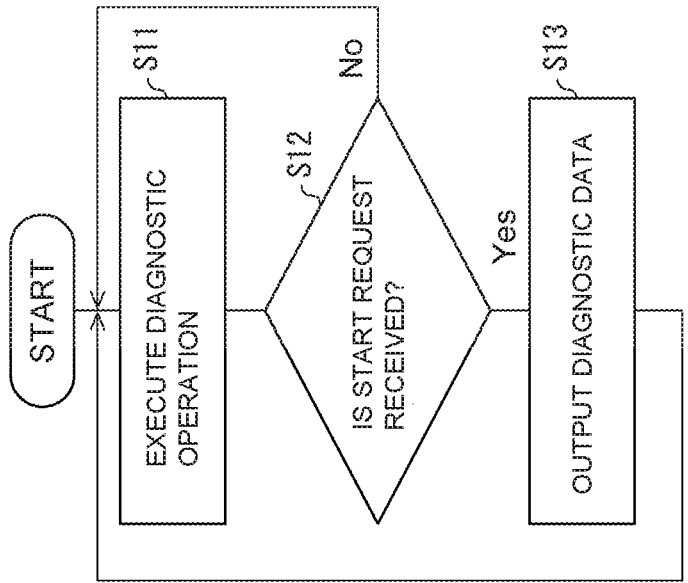
FIG. 11B is a flowchart illustrating an example of processing executed by an electric device according to a fifth embodiment of the disclosure.
Figure 11A:
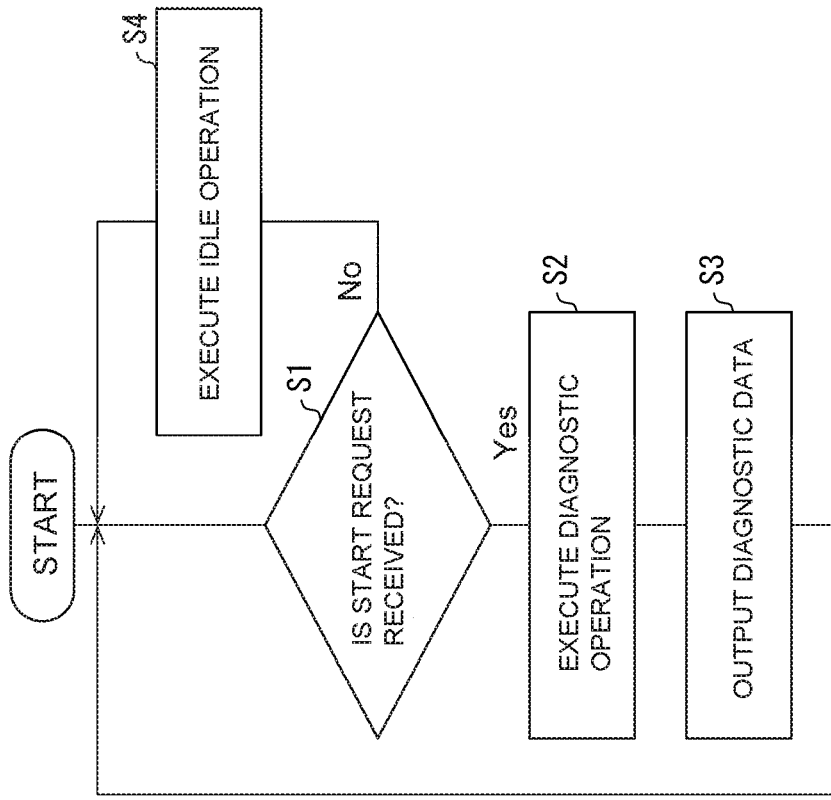
FIG. 11A is a flowchart illustrating an example of processing executed by the electric device in each of the above embodiments.

A flow of processing executed by the electric device 6 in the present embodiment is shown in FIG. 11A. FIG. 11A is a flowchart illustrating an example of processing executed by the electric device 6.

First, the arithmetic processing part 623 determines whether a request to start the diagnostic operation of the electric device 6 using the diagnostic circuit 622 is received from the outside (S1). When the arithmetic processing part 623 determines that the start request has been received (YES in S1), the arithmetic processing part 623 uses the diagnostic circuit 622 and executes the diagnostic operation (S2). Then, when the diagnostic operation is completed, the arithmetic processing part 623 outputs the diagnostic data to the outside (S3). When the arithmetic processing part 623 determines that the start request has not been received (NO in S1), the arithmetic processing part 623 executes the idle operation that needs to be executed during an idle state (S4) and waits until the start request is received.

By the above processing, the electric device 6 according to the disclosure may perform the diagnostic operation according to the start request and output the diagnostic data. By executing the idle operation when the start request is not received, the electric device 6 may suppress variation of the total value of the consumed current in the diagnostic circuit 622 and the consumed current in the arithmetic processing part 623 in a case in which the start request is not received.

The electric device 6 may have any configuration as long as the variation of the total value of the consumed current in the diagnostic circuit 622 and the consumed current in the arithmetic processing part 623 can be suppressed. Another configuration of the electric device 6 according to the present embodiment will be described.

In the electric device 6, the diagnostic circuit 622 may always execute the diagnostic processing during a period in which the output of the diagnostic result is required, and the arithmetic processing part 623 may output a diagnostic result in the diagnostic circuit 622 only at a timing at which the output of the diagnostic result needs to be performed.

(Flow of Processing)

In the present embodiment, an example of a flow of processing different from the processing illustrated in FIG. 11A is shown in FIG. 11B. FIG. 11B is a flowchart illustrating an example of processing executed by the electric device 6.

First, regardless of the presence or absence of the request to start the diagnostic operation, the arithmetic processing part 623 performs the diagnostic operation using the diagnostic circuit 622 (S11). Then, the arithmetic processing part 623 determines whether the request to start the diagnostic operation has been received from the outside (S12). When the arithmetic processing part 623 determines that the start request has been received (YES in S12), the arithmetic processing part 623 outputs the diagnostic data to a transmission source of the start request (S13), and ends a series of processing. When the arithmetic processing part 623 determines that the start request has not been received (NO in S12), the processing proceeds to S11, and the diagnostic operation is executed again.

Because the diagnostic circuit 622 always executes the diagnostic processing in the above processing, the electric device 6 may maintain current consumption in the diagnostic circuit 622 almost constant. The arithmetic processing part 623 only outputs the diagnostic result when necessary, and the current consumption is very small. Accordingly, variation of the consumed current in the electric device 6 can be suppressed.

Sixth Embodiment

Figure 12A:
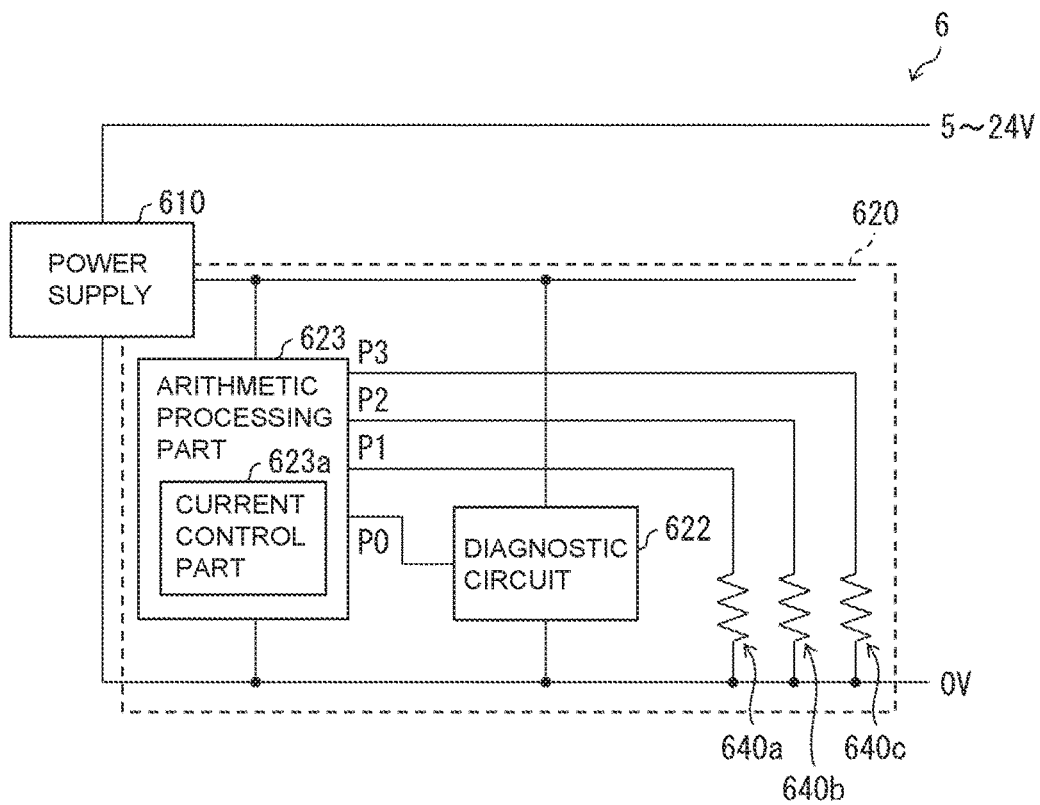
FIG. 12A is a circuit diagram illustrating an example of a circuit configuration of an electric device according to a sixth embodiment of the disclosure.

The electric device 6 according to a sixth embodiment of the disclosure will be described using FIGS. 12A and 12B. For convenience of description, members having the same functions as those described in the first embodiment will be denoted by like reference numerals, and description thereof will be omitted.

(Configuration of Electric Device)

The configuration of the electric device 6 according to the present embodiment will be described using FIG. 12A. FIG. 12A is a circuit diagram illustrating an example of a circuit configuration of the electric device 6.

Although the basic configuration of the electric device 6 is the same as that of the electric device 6 according to the third embodiment, a partial configuration is different therefrom. The electric device 6 includes, instead of a single second load 640 and the operational amplifier, three types of second loads 640a to 640c respectively connected in series to three output systems P1 to P3 of the arithmetic processing part 623. In the present embodiment, the second load 640 is configured by a plurality of loads, and the current control part 623a selects a load that consumes a current among the plurality of loads to suppress variation of the total sum of the current consumption in the current consuming part 620 and the current consumption in the circuit having the second load. In other words, when the power consumed in the diagnostic circuit 622 is temporally varied, the electric device 6 may select an appropriate load among the plurality of second loads 640a to 640c such that the total sum of the consumed current and power consumed by any one of the second loads 640a to 640c is always a predetermined consumed current value.

Although the diagnostic circuit 622 is the same as that of the third embodiment that the consumed power is temporally varied, the diagnostic circuit 622 is different from that of the third embodiment that the consumed current is varied stepwise.

Although the basic configuration of the arithmetic processing part 623 is the same as that of the third embodiment, the arithmetic processing part 623 is different therefrom that the arithmetic processing part 623 includes four output systems, P0 to P3. Although a connection destination of P0, among the four output systems, is the diagnostic circuit 622 as in the third embodiment, connection destinations of P1 to P3 are respectively the second loads 640a to 640c.

The current control part 623a may select an appropriate load among the second loads 640a to 640c such that the total sum of the consumed current of the diagnostic circuit 622 and the consumed current in each of the second loads 640a to 640c is always a predetermined consumed current value, and consume a current in the load.

The second loads 640a to 640c are loads individually connected in series to the arithmetic processing part 623. According to the illustrated example, the second load 640a is connected to the system P1 of the arithmetic processing part 623, and the second load 640b is connected to the system P2 of the arithmetic processing part 623. The second load 640c is connected to the system P3 of the arithmetic processing part 623. When the consumed current of the diagnostic circuit 622 is varied stepwise, preferably, each of the second loads 640a to 640c is configured to consume a current corresponding to a value obtained by subtracting a consumed current after each variation from a constant value. For example, when the consumed current of the diagnostic circuit 622 is varied in four steps including the maximum consumed current, preferably, with respect to three types of values of the consumed current of the diagnostic circuit 622 other than the maximum consumed current, the second loads 640a to 640c consume a current to compensate a difference between the maximum consumed current and the three types of consumed currents.

(Operation of Electric Device)

The operation of the electric device 6 according to an aspect of the disclosure will be described using FIG. 12B. FIG. 12B is a view illustrating temporal variation of a consumed current in the diagnostic circuit 622 and switching of loads according to the variation.

Figure 12B:
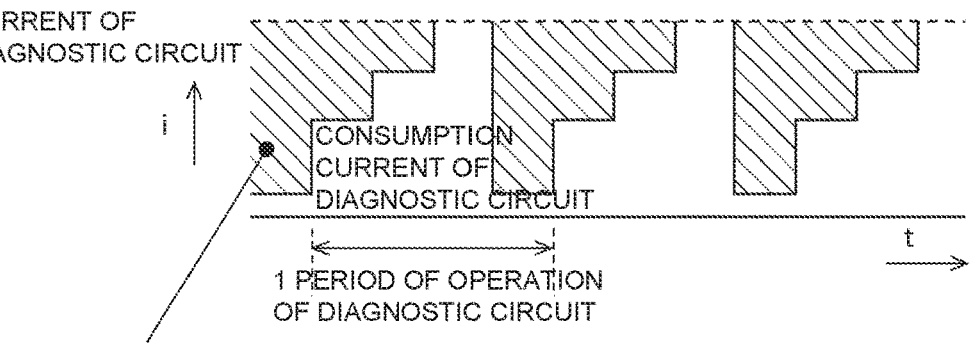
FIG. 12B is a view illustrating temporal variation of a consumed current in a diagnostic circuit.
Figure 12B:
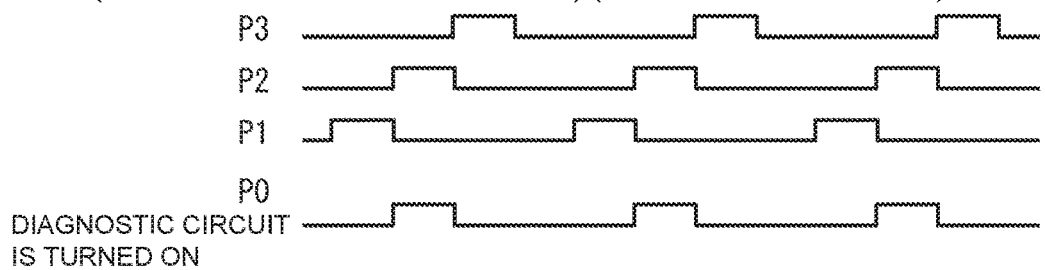

FIG. 12B is a view illustrating temporal variation of the consumed current in the diagnostic circuit 622, in which the vertical axis indicates a magnitude of the consumed current in the diagnostic circuit 622, and the horizontal axis indicates time. In the lower part of the drawing, the timing of switching between the operating state and the stop state in the diagnostic circuit 622 and the timing of switching ON/OFF of the systems P1 to P3 corresponding to the variation of the consumed current of the diagnostic circuit 622 in synchronization with the drawing are shown. In the illustrated example, the consumed current of the second load 640a connected to the system P1>the consumed current of the second load 640b connected to the system P2>the consumed current of the second load 640c connected to the third system P3>0.

In the illustrated example, first, the power consumed by the diagnostic circuit 622 is assumed to be the lowest value (=initial value) in the range that can be taken by the diagnostic circuit 622. Here, the system P1 is turned ON, and the systems P2 and P3 are turned OFF. Accordingly, power is consumed by the second load 640a connected to the system P1.

Next, when the switch of the diagnostic circuit 622 is turned ON, and transition from the stop state to the operating state begins, the consumed current of the diagnostic circuit 622 transitions from the initial value to a value of the next higher level. Here, the systems P1 and P3 are turned OFF, and the system P2 is turned ON. In this way, power is consumed by the second load 640b connected to the system P2.

Then, the switch of the diagnostic circuit 622 is switched to OFF, the transition from the operating state to the stop state begins, and the consumed current in the diagnostic circuit 622 transitions to a value of the next higher level. Here, the systems P1 and P2 are turned OFF, and P3 is turned ON. In this way, power is consumed by the second load 640c connected to the system P3.

When the consumed current in the diagnostic circuit 622 reaches the maximum consumed current, all of the systems P1 to P3 are turned OFF. Here, power is not consumed by the second loads 640 to 640c in the electric device 6. Then, when the consumed current in the diagnostic circuit 622 transitions to the initial value, as described above, only the system P1 is turned ON, and power is consumed by the second load 640a.

In this way, according to stepwise variation of power consumed by the diagnostic circuit 622, the electric device 6 according to the present embodiment may compensate for shortage of the consumed current in each step with respect to the maximum consumed current using any one of the second loads 640a to 640c.

Figure 13:
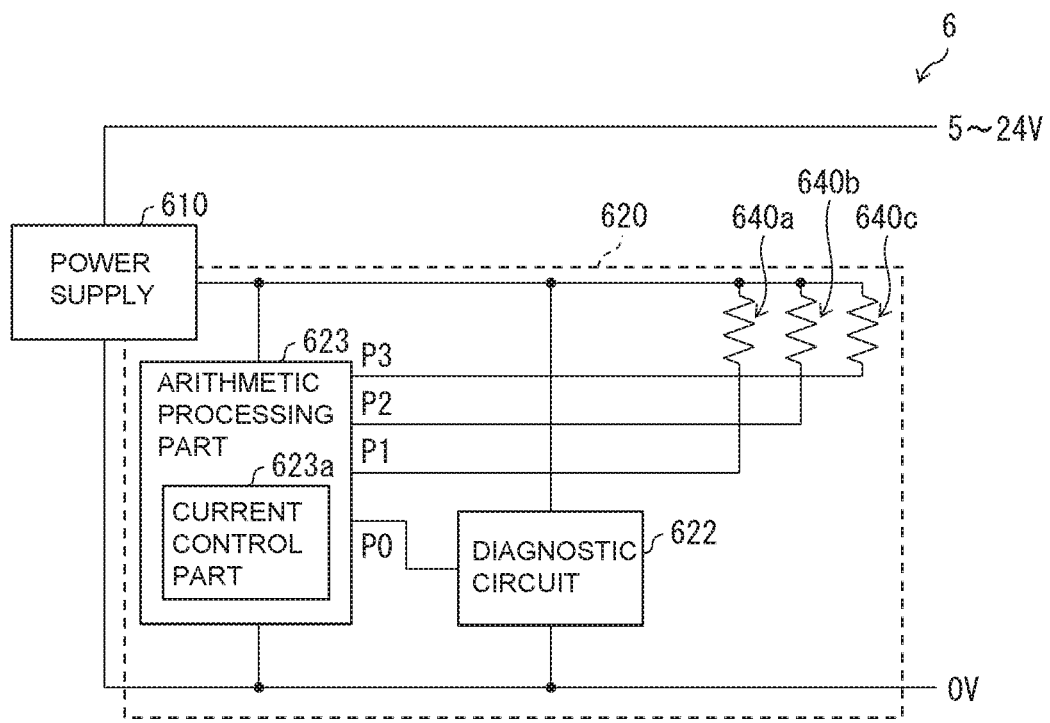
FIG. 13 is a circuit diagram illustrating an example of a circuit configuration same as that of FIG. 12A.

The second loads 640a to 640c may be arranged in any manner as long as the second loads 640a to 640c may be selected by control of the current control part 623a and may consume a current to compensate for the shortage of consumed current in each step with respect to the maximum consumed current of the diagnostic circuit 622. A configuration in which the arithmetic processing part 623 draws in a current passed through the second loads 640a to 640c will be described using FIG. 13. FIG. 13 is a circuit diagram illustrating an example of a circuit configuration same as that of FIG. 12A. In the illustrated example, the arithmetic processing part 623 is configured to respectively draw currents passed through the second loads 640a to 640c in the systems P1 to P3 from the power supply 610. Even by this configuration, the consumed current control which is the same as above can be implemented.

(Modification)

Although the second loads 640a to 640c are in one-to-one correspondence with the stepwise variations of the consumed current of the diagnostic circuit 622 in the sixth embodiment, the second loads 640a to 640c may not necessarily be in one-to-one correspondence with the stepwise variations as long as the shortage with respect to the maximum consumed current can be compensated for. For example, the shortage with respect to the maximum consumed current of the diagnostic circuit 622 may be compensated for by combining at least one of the plurality of the second loads 640a to 640c.

CONCLUSION

An electric device (6) according to a first aspect of the disclosure is an electric device that transmits an operation signal according to a state of an operating element to the outside or receives an operation signal for controlling the operating element from the outside, and transmits a superimposed signal obtained by superimposing a data signal on the operation signal to the outside, and the electric device includes a current consuming part (620) configured to consume a current following the processing in the electric device, and a current control part (623*a*) configured to control current consumption in a circuit including the current consuming part such that current variation of the superimposed signal following variation of the consumed current in the current consuming part is suppressed.

According to the above configuration, the electric device can suppress the current variation of the superimposed signal following the variation of the consumed current due to processing of the electric device. In this way, in an external device connected to the electric device, erroneous reception of a data signal included in a superimposed signal caused by variation of a consumed current in the electric device can be suppressed. Accordingly, an electric device with excellent convenience in which an influence of variation of a consumed current on a superimposed signal is suppressed can be provided.

In an electric device (6) according to a second aspect of the disclosure, according the first aspect, the current control part (623*a*) may be configured to control current consumption in the circuit including the current consuming part such that a width of current variation of the superimposed signal following variation of the consumed current in the current consuming part (620) is set to a predetermined ratio or less with respect to a width of current variation of the superimposed signal based on a change in a value of the data signal.

According to the above configuration, an external device connected to the electric device can distinguish variation of a current value according to a change in a value of a data signal included in a superimposed signal from variation of a current value derived from variation of a consumed current in the electric device.

In an electric device (6) according to a third aspect of the disclosure, according to the first or second aspect, when there is no current consumption by the current consuming part (620), the current control part (623*a*) may be configured to switch to a circuit having a first load (630) that consumes a current corresponding to a case in which the current consuming part consumes a current.

According to the above configuration, current consumption in the electric device can be maintained constant regardless of whether a current is consumed by the current consuming part. In this way, in an external device connected to the electric device, erroneous reception of a data signal included in a superimposed signal caused by variation of a consumed current in the electric device can be suppressed.

In an electric device (6) according to a fourth aspect of the disclosure, according to any one of the first to third aspects, a circuit having a second load (640, 640*a* to 640*c*) may be included, and when a current when the current consuming part (620) consumes the current continuously changes, the current control part (623*a*) may be configured to perform control that continuously changes a consumed current in the second load to cancel the continuous change.

According to the above configuration, even when current consumption in the current consuming part is continuously changing, the electric device can suppress variation of an overall consumed current. In this way, in an external device connected to the electric device, erroneous reception of a data signal included in a superimposed signal caused by variation of a consumed current in the electric device can be suppressed.

In an electric device (6) according to a fifth aspect of the disclosure, according to any one of the first to third aspects, a circuit having a second load (640, 640*a* to 640*c*) may be included, and the current control part (623*a*) may include a third load (650) for detecting a current value input to the current consuming part (620) and be configured to change a consumed current in the second load according to a magnitude of voltage drop by the third load.

According to the above configuration, the electric device can detect a current value input to the current consuming part by using the third load and control current consumption in the second load according to the current value.

In an electric device (6) according to a sixth aspect of the disclosure, according to the fourth aspect, the second loads (640*a* to 640*c*) may be configured by a plurality of loads, and the current control part (623*a*) may be configured to select a load that consumes a current among the plurality of loads such that variation of a total sum of the current consumption in the current consuming part (620) and the current consumption by the circuit having the second loads is suppressed.

According to the above configuration, the electric device can maintain the total sum of current consumption in the current consuming part and the circuit having the second loads to be constant. In this way, in an external device connected to the electric device, erroneous reception of a data signal included in a superimposed signal caused by variation of a consumed current in the electric device can be suppressed.

In an electric device (6) according to a seventh aspect of the disclosure, according to any one of the first to sixth aspects, the current consuming part (620) may include at least one of a light emitting part (621) configured to perform at least one of turning on a light, turning off the light, and flashing the light, a diagnostic circuit (622) configured to diagnose the presence or absence of a failure in the electric device, and an arithmetic processing part (623) including the current control part (623*a*).

According to the above configuration, the electric device can suppress current variation of a superimposed signal following variation of a consumed current in at least one of the light emitting part, the diagnostic circuit, and the arithmetic processing part.

In an electric device (6) according to an eighth aspect of the disclosure, according to the seventh aspect, the current control part (623*a*) may be configured to perform execution control of arithmetic processing in the arithmetic processing part such that variation of a total value of a consumed current in the diagnostic circuit (622) and a consumed current in the arithmetic processing part (623) is suppressed.

According to the above configuration, the electric device can suppress variation of a total value of a consumed current in the diagnostic circuit and a current in the arithmetic processing part by performing execution control of arithmetic processing in the arithmetic processing part.

In an electric device (6) according to a ninth aspect of the disclosure, according to the seventh aspect, the diagnostic circuit (622) may be configured to always execute diagnostic processing during a period in which an output of a diagnostic result is required, and the arithmetic processing part (623) may be configured to output the diagnostic result in the diagnostic circuit only at a timing at which the output of the diagnostic result needs to be performed.

According to the above configuration, since the diagnostic circuit always executes the diagnostic processing, the electric device can maintain current consumption to be almost constant. The arithmetic processing part only outputs the diagnostic result when necessary, and the current consumption is very small. Accordingly, variation of the consumed current in the electric device can be suppressed.

[Implementation by Software]

Processing of the arithmetic processing part 623 and the current control part 623a may be implemented by a logic circuit (hardware) formed on an IC chip or the like or may be implemented by software using a central processing unit (CPU).

In the latter case, the arithmetic processing part 623 and the current control part 623a include a CPU executing a command of a program, which is software implementing each function, a read only memory (ROM) or memory (this is referred to as a "recording medium") in which the program and various pieces of data are recorded to be readable by a computer (or CPU), a random access memory (RAM) in which the program is developed, and the like. The effects of the disclosure are achieved by the computer (or CPU) reading the program from the recording medium and executing the program. A "non-temporary type medium" such as a tape, a disk, a card, a semiconductor memory, and a programmable logic circuit may be used as the recording medium. The program may be supplied to the computer via an arbitrary transmission medium (a communication network, a broadcast wave, or the like) capable of transmitting the program. An aspect of the disclosure may be implemented even when the program is in the form of a data signal included in a carrier wave, realized by electronic transmission.

An electric device according to an aspect of the disclosure is an electric device that transmits an operation signal according to a state of an operating element to the outside or receives an operation signal for controlling the operating element from the outside, and transmits a superimposed signal obtained by superimposing a data signal on the operation signal to the outside, and the electric device includes a current consuming part configured to consume a current following the processing in the electric device, and a current control part configured to control current consumption in a circuit including the current consuming part such that current variation of the superimposed signal following variation of the consumption power in the current consuming part is suppressed.

In the electric device according to an aspect of the disclosure, the current control part may be configured to control current consumption in the circuit including the current consuming part such that a width of current variation of the superimposed signal following variation of the consumed current in the current consuming part is set to a predetermined ratio or less with respect to a width of current variation of the superimposed signal based on a change in a value of the data signal.

In the electric device according to an aspect of the disclosure, when there is no current consumption by the current consuming part, the current control part may be configured to switch to a circuit having a first load that consumes a current corresponding to a case in which the current consuming part consumes a current.

In the electric device according to an aspect of the disclosure, a circuit having a second load may be included, and when a current when the current consuming part consumes the current continuously changes, the current control part may be configured to perform control that continuously changes a consumed current in the second load to cancel the continuous change.

In the electric device according to an aspect of the disclosure, a circuit having a second load may be included, and the current control part may include a third load for detecting a current value input to the current consuming part and be configured to change a consumed current in the second load according to a magnitude of voltage drop by the third load.

In the electric device according to an aspect of the disclosure, the second load may be configured by a plurality of loads, and the current control part may be configured to select a load that consumes a current among the plurality of loads such that variation of a total sum of the current consumption in the current consuming part and the current consumption by the circuit having the second load is suppressed.

In the electric device according to an aspect of the disclosure, the current consuming part may include at least one of a light emitting part configured to perform at least one of turning on a light, turning off the light, and flashing the light, a diagnostic circuit configured to diagnose the presence or absence of a failure in the electric device, and an arithmetic processing part including the current control part.

In the electric device according to an aspect of the disclosure, the current control part may be configured to perform execution control of arithmetic processing in the arithmetic processing part such that variation of a total value of a consumed current in the diagnostic circuit and a consumed current in the arithmetic processing part is suppressed.

In the electric device according to an aspect of the disclosure, the diagnostic circuit may be configured to always execute diagnostic processing during a period in which an output of a diagnostic result is required, and the arithmetic processing part may be configured to output the diagnostic result in the diagnostic circuit only at a timing at which the output of the diagnostic result needs to be performed.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electric device that transmits a first operation signal according to a state of an operating element to the outside or receives a second operation signal for controlling the operating element from the outside, and transmits a superimposed signal obtained by superimposing a data signal on the first operation signal to the outside, the electric device comprising:

a first circuit, the first circuit comprising a current consuming part, the current consuming part consumes a current following processing in the electric device; and a current control part controls current consumption in the first circuit such that current variation of the superimposed signal following variation of the current consumption in the current consuming part is suppressed;

wherein the current control part controls current consumption in the first circuit such that a width of current variation of the superimposed signal following variation of the consumed current in the current consuming part is set to a predetermined ratio or less with respect to a width of current variation of the superimposed signal based on a change in a value of the data signal.

2. The electric device according to claim 1 wherein, when there is no current consumption by the current consuming part, the current control part switches to a circuit having a first load that consumes a current corresponding to a case in which the current consuming part consumes a current.

3. The electric device according to claim 1, wherein the current consuming part includes at least one of:
   a light emitting part performs at least one of turning on a light, turning off the light, and flashing the light;
   a diagnostic circuit, the diagnostic circuit comprises a check circuit configured to generate diagnostic data indicating whether the electric device is in normal operation; and
   an arithmetic processing part including the current control part.

4. The electric device according to claim 1, wherein the current consuming part includes at least one of:
   a light emitting part performs at least one of turning on a light, turning off the light, and flashing the light;
   a diagnostic circuit, the diagnostic circuit comprises a check circuit configured to generate diagnostic data indicating whether the electric device is in normal operation; and
   an arithmetic processing part including the current control part.

5. The electric device according to claim 1, wherein, when there is no current consumption by the current consuming part, the current control part switches to a circuit having a first load that consumes a current corresponding to a case in which the current consuming part consumes a current.

6. The electric device according to claim 5, wherein the current consuming part includes at least one of:
   a light emitting part performs at least one of turning on a light, turning off the light, and flashing the light;
   a diagnostic circuit, the diagnostic circuit comprises a check circuit configured to generate diagnostic data indicating whether the electric device is in normal operation; and
   an arithmetic processing part including the current control part.

7. The electric device according to claim 1, comprising a second circuit having a second load,
   wherein, when a current consumed by the current consuming part continuously changes, the current control part performs control that continuously changes a consumed current in the second load to cancel the continuous changes of the current consumed by the current consuming part.

8. The electric device according to claim 7, wherein the current consuming part includes at least one of:
   a light emitting part performs at least one of turning on a light, turning off the light, and flashing the light;
   a diagnostic circuit, the diagnostic circuit comprises a check circuit configured to generate diagnostic data indicating whether the electric device is in normal operation; and
   an arithmetic processing part including the current control part.

9. The electric device according to claim 8, wherein the current control part performs execution control in the arithmetic processing part such that variation of a total value of a consumed current in the diagnostic circuit and a consumed current in the arithmetic processing part is suppressed.

10. The electric device according to claim 8, wherein the check circuit always generates diagnostic data during a period in which diagnostic data is required, and the arithmetic processing part outputs the diagnostic data only at a timing at which the output of the diagnostic data needs to be performed.

11. The electric device according to claim 8, wherein the current control part performs execution control in the arithmetic processing part such that variation of a total value of a consumed current in the diagnostic circuit and a consumed current in the arithmetic processing part is suppressed.

12. The electric device according to claim 8, wherein the check circuit always generates diagnostic data during a period in which diagnostic data is required, and the arithmetic processing part outputs the diagnostic data only at a timing at which the output of the diagnostic data needs to be performed.

13. The electric device according to claim 1, comprising a second circuit having a second load,
   wherein the current control part includes a third load for detecting a current value input to the current consuming part and changes a consumed current in the second load according to a magnitude of voltage drop by the third load.

14. The electric device according to claim 13, wherein the current consuming part includes at least one of:
   a light emitting part performs at least one of turning on a light, turning off the light, and flashing the light;
   a diagnostic circuit, the diagnostic circuit comprises a check circuit configured to generate diagnostic data indicating whether the electric device is in normal operation; and
   an arithmetic processing part including the current control part.

15. The electric device according to claim 7, wherein:
   the second load is configured by a plurality of loads; and
   the current control part selects a load that consumes a current among the plurality of loads such that variation of a total sum of the current consumption in the current consuming part and the current consumption by the circuit having the second load is suppressed.

16. The electric device according to claim 15, wherein the current consuming part includes at least one of:
   a light emitting part performs at least one of turning on a light, turning off the light, and flashing the light;
   a diagnostic circuit, the diagnostic circuit comprises a check circuit configured to generate diagnostic data indicating whether the electric device is in normal operation; and
   an arithmetic processing part including the current control part.

17. The electric device according to claim 16, wherein the current control part is performs execution control of arithmetic processing in the arithmetic processing part such that variation of a total value of a consumed current in the diagnostic circuit and a consumed current in the arithmetic processing part is suppressed.

18. The electric device according to claim 16, wherein the diagnostic circuit is always executes diagnostic processing during a period in which an output of a diagnostic result is required, and the arithmetic processing part is outputs the diagnostic result in the diagnostic circuit only at a timing at which the output of the diagnostic result needs to be performed.

* * * * *